United States Patent [19]

Boreas

[11] 4,440,271

[45] Apr. 3, 1984

[54] VISCOUS DAMPENING ARRANGEMENT FOR TAUT-BAND SUSPENSION

[75] Inventor: Willem J. L. Boreas, Sayerville, N.J.

[73] Assignee: Sangamo Weston, Inc., Norcross, Ga.

[21] Appl. No.: 387,102

[22] Filed: Jun. 10, 1982

[51] Int. Cl.³ .................. F16F 9/30; F16D 57/00
[52] U.S. Cl. ................................... 188/268; 188/266; 324/125; 324/154 R
[58] Field of Search .................. 188/268, 266, 378; 324/125, 154 R; 73/430

[56] References Cited

U.S. PATENT DOCUMENTS

| | | | |
|---|---|---|---|
| 2,998,868 | 9/1961 | Meier | 188/266 |
| 3,439,273 | 4/1969 | Sills | 188/266 |
| 3,494,203 | 2/1970 | Efimenko et al. | 324/125 |
| 3,891,921 | 6/1975 | Patterson | 324/125 |
| 3,919,632 | 11/1975 | Roerty | 324/125 |

Primary Examiner—Bruce H. Stoner, Jr.
Assistant Examiner—Robert J. Oberleitner
Attorney, Agent, or Firm—Dale Gaudier

[57] ABSTRACT

An improved viscous dampening arrangement for a taut-band suspension system in an electrical indicating instrument includes a hub associated with the stator and a turret associated with the rotor. The hub and turret each have central openings for receiving the taut-band. The hub and turret are arranged, in use, in a spaced-apart facing relationship with the facing portions of hub and turret being tapered in a controlled fashion. A viscous dampening fluid is provided between the hub and turret and an anti-wetting agent is applied to the surfaces of the hub and turret where the dampening fluid is not desired. The geometry of the tapers is chosen so as to minimize the effects of longitudinal and radial shocks and vibrations on the electrical indicating instrument.

8 Claims, 2 Drawing Figures

VISCOUS DAMPENING ARRANGEMENT FOR TAUT-BAND SUSPENSION

BACKGROUND OF THE INVENTION

1. Field of the Invention

The invention relates to a viscous dampening arrangement for a taut-band suspension system used in an electrical indicating instrument of the moving coil type and, more particularly, to such an arrangement having improved vibration dampening characteristics.

2. Description of the Prior Art

Electrical indicating instruments of the D'Arsonval or moving coil types are well known and generally include two portions: a rotor to which a coil and pointer are mounted, and a stator from which the rotor is suspended and to which a permanent magnet is mounted.

Two types of suspension systems for such electrical indicating instruments are in common use. The first utilizes a combination of a pivot and jewel provided between the stator and rotor parts in order to provide a relatively low friction movement between these parts. However, this type of suspension system is relatively sensitive to vibration and its performance gradually deteriorates over time due to wear between the pivot and jewel components. The second type, called a taut-band suspension, utilizes a thin ribbon or band of metal (or other electrically conductive relatively inelastic material) anchored, under tension, between the stator and rotor parts.

Taut-band suspension systems are noted for their relative insensitivity to vibration and shock and for their long life. However, it has been found that at certain frequencies of shock or vibration, the rotor or stator component can become resonant and thereby cause the position of a pointer attached to the rotor to oscillate, thereby lowering the accuracy of any reading. In addition, under high amplitudes of shock, the rotor and stator portions may be caused to physically contact each other. This can cause anomalous motion or readings by the pointer and also leads to increased wear on the parts.

In order to overcome these problems a taut-band suspension systems it has been proposed to provide a viscous dampening fluid between the rotor and stator parts. Such an arrangement, for example, is shown in U.S. Pat. No. 3,439,273 to Sills. In Sills, annular rings or pads of a closed-cell expanded foam are provided between facing portions of the rotor and stator parts. A viscous dampening fluid is provided therebetween and is held in position because of the high surface tension provided by the irregular surfaces of the foam pads. The viscous dampening fluid acts as a shock absorber and a vibration dampener when the instrument is subjected to shock or vibration. However, the Sills arrangement suffers from the disadvantage that it can only provide cushioning for shock or vibration along the longitudinal axis. If the vibration or shock has a component which is not parallel to the longitudinal axis the viscous dampening arrangement will not function properly since there is nothing to constrain the movement of the parts in a direction perpendicular to the taut-band. In addition, the large contact area between the viscous dampening fluid and the pads mounted on the stator and rotor parts drastically impedes the response time of the instrument.

SUMMARY OF THE INVENTION

These and other disadvantages of prior art viscous dampening arrangements are overcome by the present invention wherein there is provided an improved viscous dampening arrangement for a taut-band suspension system for use in electrical indicating instruments such as a panel meter, which include a stator part and rotor part. The arrangement includes a hub mounted to or formed as part of the stator and a turret attached to or formed as part of the rotor, the hub and rotor having central openings for receiving the taut-band. The hub and turret are arranged, in use, in a spaced-apart, facing relationship with the facing portions of hub and turret being tapered in a controlled fashion. A viscous dampening fluid is provided between the hub and turret and an anti-wetting agent is applied to the surfaces of the hub and turret where the dampening fluid is not desired. The geometry of the tapers is chosen so as to minimize the effects of longitudinal and radial shocks and vibrations on the electrical indicating instrument.

More particularly, the hub includes a central bore provided along its longitudinal axis and a first tapered opening provided at least at one end of the central bore. An annular lip is formed at the other end of the central bore and is surrounded by a second tapered opening. A longitudinal opening is formed in the turret, with the opening comprising a pair of tapered openings joined at their narrowest portions. An exterior tapered portion surrounds one of the tapered openings formed in the turret. The hub and turret are arranged to receive a taut-band of the taut-band suspension system along their longitudinal axes, the tapered portion of the turret being arranged in a spaced-apart, facing relationship with respect to the annular lip in the second tapered opening of the hub.

A viscous dampening fluid is provided within the central bore of the hub and in contact with the annular lip thereof and the facing portion of the tapered opening provided in the turret. The exterior tapered portion of the turret, and the first and second tapered openings of the hub are all provided with anti-wetting means so as to prevent the viscous dampening fluid from flowing along these surfaces.

Preferably, the tapered openings of the turret and hub and the tapered portion of the turret are frusto-conical in shape with their respective vertices lying along the longitudinal axis of the assembled hub and turret parts. The facing portions of the annular lip and surrounding tapered opening of the hub and the exterior tapered portion of the turret have differing angles of tapers so as to form an annular labyrinthine channel of nonuniform cross-section when the turret and hub parts are assembled.

The described arrangement enables the hub and turret parts to be positioned further apart than has been heretofor possible with prior art arrangements. The particular geometry of the cylindrical bore of the hub and tapered surfaces of the turret provides an area in which the viscous dampening fluid forms a "bubble" at the end of the bore of the hub, thereby greatly increasing the shock absorbing and vibration dampening abilities between the parts. Further, the combination of the geometry of the tapers and the use of an anti-wetting agent on selected surfaces prevents the escape of viscous dampening fluid from the system even when subjected to large shocks and vibration. This, in turn, prevents mechanical contact from occurring between the hub and turret parts and increases the stability of the rotor (and hence reduces the undesirable movement of any pointer attached thereto due to vibration or shock) when subjected to such stresses without adversely affecting the response time of the meter mechanism.

In addition, the hub and turret parts can be readily molded from plastic and therefor do not need any special machining steps, nor do they require any special viscous dampening fluid pads as have been used in some prior art devices. The hub and turret parts are therefor relatively inexpensive and easy to manufacture.

BRIEF DESCRIPTION OF THE DRAWING FIGURES

These and other features and advantages of the present invention will be apparent from the following detailed description of the preferred embodiments, when taken in conjunction with the accompanying drawing figures, wherein.

DESCRIPTION OF THE PREFERRED EMBODIMENTS

Figure 1:
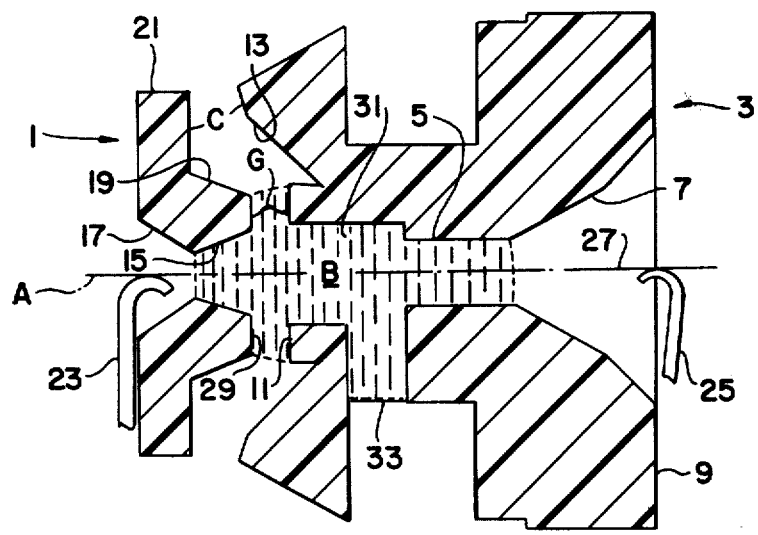
FIG. 1 is a cross-section of a first embodiment of the invention.

FIG. 1 shows a first embodiment of the invention. A turret 1 and hub 3 are disposed in a spaced-apart, facing relationship about their mutually aligned longitudinal axis A. Hub 3 includes a central bore 5 which may have a constant or varying diameter as shown in FIG. 1. One end of bore 5 has a tapered opening 7 which communicates between the bore and the rear surface 9 of the hub.

At the opposite end of bore 5 there is an annular lip 11 formed about the bore. Surrounding annular lip 11 is a second tapered opening 13.

Turret 1 has a longitudinal opening formed by a pair of tapered openings 15 and 17 joined at their narrowest portions. Turret 1 further includes an exterior tapered portion 19 surrounding tapered opening 15. An annular flange 21 forms the remainder of turret 1.

As will be appreciated, turret and hub parts 1 and 3, and the various tapered openings or portions formed therein take the form of figures of revolution. Thus, the tapered elements 7, 13, 15, and 17 are each frusto-conical in shape having each of their respective vertices lying along longitudinal axis A when turret 1 and hub 3 are assembled together. When turret 1 and hub 3 are so arranged the surfaces 13 and 19 and the portion of flange 21 facing surface 13 form a labyrinthine channel or passage C having a tapering, nonuniform cross-section.

As shown in FIG. 1, turret 1 and hub 3 respectively carry suspension springs 23 and 25 to which taut-band 27 is mounted in a conventional manner. Spring 23 is relatively stiff while spring 25 is relatively flexible to provide tension to taut-band 27. Taut-band 27 is aligned along longitudinal axis A and has a length such that when the hub and turret parts are respectively mounted to the stator and rotor a gap G is formed between annular lip 11 and surface 29 of turret 1. The moving coil mechanism and pointer are mounted to the rotor (not shown) which is attached to turret 1 in a conventional fashion.

An anti-wetting agent, such as Fluorad FC-721 (a solution of oleophobic-hydrophobic fluorochemical polymer in Freon) manufactured by the 3M Co., is applied to the surfaces of tapered openings 7 and 13, a portion of annular lip 11, tapered opening 17, tapered portion 19, the portion of flange 21 which faces tapered opening 13, and the area surrounding radial opening 33, as shown by the heavy black lining on these surfaces in FIG. 1. The purpose of the anti-wetting agent is to reduce or prevent a viscous dampening fluid 31, such as 510 Silicone Fluid (brand of phenylmethyl polysiloxane), manufactured by Dow-Corning Corp., applied to bore 5 of hub 3 through radial opening 33, from readily flowing out onto the treated surfaces.

As shown in FIG. 1, a quantity of viscous dampening fluid 31 is injected into cylindrical bore 5 of sufficient quantity to fill up bore 5 and to fill the gap G between turret 1 and hub 3 and tapered opening 15 of the turret. Due to the surface tension of dampening fluid 31 and the geometry of tapered opening 15 and the gap G formed between surface 29 of turret 1 and annular flange 11 of hub 3, a bubble B, whose surface is shown by dashed outline in FIG. 1, is formed between the turret 1 and hub 3.

As will be appreciated, under equilibrium (unstressed) conditions, dampening fluid 31 contained in bore 5 and between turret 1 and hub 3 (bubble B) remains within the defined area due to its inherent surface tension and the effects of the anti-wetting agent applied to surfaces where the viscous dampening fluid is not desired. However, under conditions of shock or vibration, dampening fluid 31 provides shock absorption and vibration attenuation in two ways: first, layers or sheets of molecules comprising the viscous dampening fluid slide or "shear" with respect to each other to thereby dampen vibrations, and second, the fluid physically flows in certain preferred directions, dictated by the geometry of the facing portions of the hub and turret, to thereby accomodate motion between the hub and turret.

In an electrical indicating instrument, such as a moving coil panel meter, shock and vibration can be resolved into two components, namely motion along the longitudinal axis of the stator and rotor (i.e. along axis A in FIG. 1), and radially (i.e. perpendicular) to the longitudinal axis. As will be appreciated, typical stresses due to shock or vibration exhibit both longitudinal and radial components.

In some prior art designs, it was necessary to provide relatively wide annular facing portions between the stator and rotor with a viscous dampening fluid engaged therebetween in order to provide sufficient dampening between rotor and stator when the rotor moved relative thereto. However, in these types of designs the large contact areas between the fluid and annular facing portions of the stator and rotor drastically impede the response time of the instrument. In addition, these designs are highly susceptible to shock or vibration having a component perpendicular (i.e. radial) to the axis of the taut-band suspension, since there is little or no constraint on the motion of these parts in this direction. They are also susceptible to high amplitude longitudinal shock or vibration components since the gap between the facing portions of the stator and rotor cannot be made too large, otherwise the viscous dampening fluid will flow out and be lost. Indeed, under conditions of high amplitude longitudinal shock or vibration the viscous dampening fluid can be almost completely squeezed out between the stator and rotor.

In the present invention, the particular geometry of the facing portions of the hub and turret (which can be considered extensions of the stator and rotor respectively) cause a bubble B of viscous damping fluid 31 to be formed therebetween which readily absorbs shock and attenuates vibration having both longitudinal and radial components.

When the hub, turret, and taut-band suspension system of FIG. 1 is subjected to shock or vibration having a radial component, viscous dampening is caused by the shearing forces in the layers of viscous dampening fluid 31. The first layer of fluid directly adjacent to a solid surface (such as surface 29 and annular lip 11 which form gap G) does not move with respect to the solid surface. A second layer of fluid adjacent to the first layer moves slightly with respect to the first layer. A third layer moves with respect to the second and so on until the Nth layer has reached the speed of movement of the rotor and stator. The shearing between the layers of fluid dampens the radial components of vibrations applied perpendicular to the axis A of the hub and turret. The amount of viscous dampening depends on the size of the surface contact area between the fluid and rotating parts and the viscosity of the fluid. In order to keep the effect on the response time to a minimum, the contact area must be kept to a minimum, such as provided by surface 29 and annular lip 11.

In order to absorb horizontal vibration and shock components, turret 1 is provided with tapered opening 15 and annular surface 29 which, in conjunction with annular lip 11 and central bore 5 of hub 3, cause a bubble B of viscous dampening fluid 31 to be formed between the turret and hub. This causes a larger volume of viscous dampening fluid to be trapped between turret 1 and hub 3 which increases the capabilities of the fluid to absorb shock and vibration having radial components through the aforementioned shearing process. The tapered surfaces will always provide horizontal and vertical components, no matter what direction the force is applied. Under such longitudinal shock or vibration force components the space between the turret and hub parts will alternately be reduced and increased. During the reduction in space, the viscous dampening fluid of the bubble B is compressed and will balloon out the largest outside diameter of the bubble. If the spacing or gap G and the outlets of both bore 5 and tapered opening 15 are reduced to the point where the capillary action forces become greater than the surface tension forces of the fluid, the fluid will move over the barrier coating (e.g. the anti-wetting agent) and be lost. In order to avoid this loss of fluid due to capillary action, sufficient space must be provided directly outside the bubble to keep the capillary forces lower than the surface tension forces. This is achieved by providing tapered opening 7 adjacent to one end of bore 5 in hub 3, tapered opening 17 communicating with tapered opening 15 in turret 1, and the labyrinthine channel C formed by surface 13 of hub 3, and tapered portion 19 of turret 1 and the portion of annular flange 21 facing the hub. The large surface area of channel C and surfaces 7 and 17 immediately adjacent fluid 31 reduces the tendency of the fluid to flow out through openings 7 and 17 and channel C.

Thus, when turret 1 and hub 3 are subjected to shock and vibration having both longitudinal and radial components the bubble B acts as a shock absorber and will transfer the shock and vibration forces through the fluid 31 perpendicular to the containing surfaces.

Figure 2:
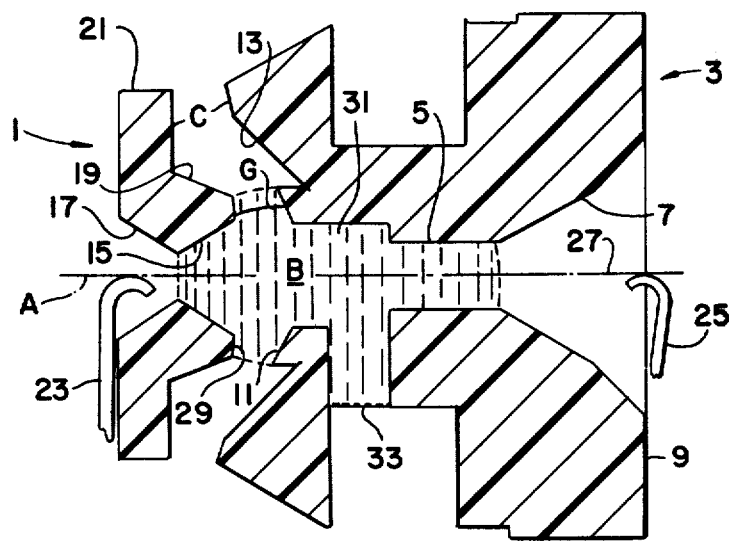
FIG. 2 is a cross-section of a second embodiment of the invention.

In FIG. 2 an alternative arrangement for the present invention is shown. Similar reference numerals denote identical parts in the two drawing figures. Turret 1 and hub 3 are identical in form and shape to that shown and described above with reference to FIG. 1 except that the portion of annular lip 11 which faces turret 1 is formed having a slight taper, and tapered opening 15 is formed having a slightly greater angle with respect to longitudinal axis A. These arrangements increase the volume of viscous dampening fluid 31 which can be contained in bubble B between turret 1 and hub 3 and the amount of tapered surfaces for absorbing shock or vibration stresses having both longitudinal and radial components. This further enhances the vibration dampening and shock absorption qualities of the invention.

While the present invention has been described in considerable detail, various changes and modifications will suggest themselves to those skilled in the art. For example, the anti-wetting means does not necessarily have to be in the form of a coating of an anti-wetting agent; the anti-wetting means could be in the form of a solid material or other surface treatment to which the viscous dampening fluid will not readily adhere. In addition, while the hub and turret have been described as separate components, they may be formed integral with the stator and rotor, respectively. The disclosure of the invention is intended to be illustrative, and not limitative, of the invention which is defined by the appended claims.

I claim:

1. An improved viscous dampening arrangement for a taut-band suspension system in an electrical indicating instrument, the instrument including stator means and rotor means and comprising:

a hub associated with the stator means, the hub having a central bore provided along its longitudinal axis;

a first tapered opening provided at least at one end of the central bore;

an annular lip formed at the other end of the central bore and surrounded by a second tapered opening;

a turret associated with the rotor means, the turret having a pair of tapered openings formed along its longitudinal axis and joined at their narrowest portions;

an exterior tapered portion surrounding one of the tapered openings formed in the turret;

the hub and turret being arranged to receive a taut-band of the taut-band suspension system along their longitudinal axes, the exterior tapered portion of the turret being arranged in a spaced-apart, facing relationship with respect to the annular lip and second tapered opening of the hub;

a viscous dampening fluid provided within the central bore of the hub and in contact with the annular lip thereof and the facing portion of the tapered opening provided in the turret; and wherein the other tapered opening of the turret, the exterior tapered portion of the turret, and the first and second tapered openings of the hub are all provided with anti-wetting means.

2. The arrangement of claim 1 wherein the tapered openings and exterior tapered portion of the turret and the tapered openings of the hub are frusto-conical in shape, each having their respective vertices lying along the longitudinal axis of the assembled hub and turret.

3. The arrangement of claim 1 wherein the facing portions of the annular lip and surrounding tapered opening of the hub and the exterior tapered portion of the turret have differing angles of tapers so as to form an annular labyrinthine channel of non-uniform cross-section when the hub and turret are assembled to the taut-band suspension.

4. The arrangement of claim 1 wherein the annular lip of the hub is tapered toward the central bore of the hub.

5. The arrangement of claim 1 wherein the turret and hub are formed integral with the rotor means and stator means, respectively.

6. The arrangement of claim 1 wherein the hub includes a radial opening connected to the central bore, for introducing the viscous dampening fluid into the bore after assembly of the hub and turret to the taut-band suspension system.

7. The arrangement of claim 6 wherein the anti-wetting means is applied to an exterior portion of the radial opening in the hub.

8. The arrangement of claims 1 or 7 wherein the anti-wetting means is a coating of an anti-wetting agent which reduces the tendency of the viscous dampening fluid to escape through the openings due to capillary action.

* * * * *